United States Patent [19]

Gheewala

[11] 4,365,317
[45] Dec. 21, 1982

[54] SUPERCONDUCTIVE LATCH CIRCUIT

[75] Inventor: Tushar R. Gheewala, Yorktown Heights, N.Y.

[73] Assignee: International Business Machines Corporation, Armonk, N.Y.

[21] Appl. No.: 175,566

[22] Filed: Aug. 6, 1980

[51] Int. Cl.³ .................................................. G11C 11/44
[52] U.S. Cl. .................................... 365/162; 365/160
[58] Field of Search ............................. 365/162, 160

[56] References Cited

U.S. PATENT DOCUMENTS

| | | | |
|---|---|---|---|
| 4,136,290 | 1/1979 | Davidson | 365/162 |
| 4,151,605 | 4/1979 | Faris | 365/162 |
| 4,198,577 | 4/1980 | Faris | 365/162 |
| 4,210,921 | 7/1980 | Faris | 365/162 |

OTHER PUBLICATIONS

IBM Technical Disclosure Bulletin, vol. 20, No. 11B, Apr. 1978, pp. 4970-4972, P. C. Arnett et al, "Unilateral Current Injection Memory Cell".
IBM Technical Disclosure Bulletin, vol. 20, No. 7, Dec. 1977, pp. 2897-2898, P. C. Arnett et al, "DC Biased High Density Josephson NDRO Memory Cell".
IBM Technical Disclosure Bulletin, vol. 22, No. 8A, Jan. 1980, pp. 3432-3433, A. Davidson, "Reset-Override Latch for Current Injection Logic & DC . . . ".

*Primary Examiner*—Terrell W. Fears
*Attorney, Agent, or Firm*—Jackson E. Stanland

[57] ABSTRACT

This superconductive latch circuit uses superconductive switching devices and can be powered by the same phase of AC power used to power other circuits with which the latch is used. The latch is comprised of a storage loop including a superconductive switch and an inductor. It is also comprised of another superconductive switch through which an AC gate current can flow and whose state determines whether or not the AC current is delivered to the superconductive storage loop. Information is stored in the loop as the presence and absence of a circulating current of either polarity. In a variation of this latch, an output of the sense circuit which detects the state of the storage loop if fed back as a control signal to the superconductive switch in the storage loop and also as one input to an AND gate to which a SET signal is also applied. AC power is switched to the storage loop when both inputs to the AND circuit are simultaneously present. In another variation, the signal which is fed back from the sense circuit is an input to an OR gate, whose output is the control signal to the switch in the storage loop. This latch reliably holds data when the AC power diminishes to zero, and also when the AC power changes polarity.

23 Claims, 5 Drawing Figures

SUPERCONDUCTIVE LATCH CIRCUIT

DESCRIPTION

1. Technical Field

This invention relates to improved latch circuits of the type employing superconductive switches and current carrying conductors, and even more particularly to superconductive latches using switching devices through which Josephson currents pass.

2. Background Art

In memory and logic circuits, it is known to use latches to hold data, where the latch retains its data state in the absence of a signal to change its data state. Latches are also known to provide a synchronization function in a computer, the latch output providing the synchronization signal.

In some circuitry, such as that employing Josephson tunneling devices, it is desirable to use AC power to drive both the logic circuits and the latches. In prior art Josephson device systems, it has often been the situation that it was necessary to use DC power for the latches, or a second phase of the AC power. In those systems, data in the latches would be lost when the AC power went to zero, and for this reason the separate power source was required.

Thus, in the provision of circuits using latches and AC power to the latches, it is desirable that the information in the latches be maintained both when the AC power goes to zero and when it changes polarity. It is also desirable to provide a latch which does not require an excessive number of switching devices (such as Josephson interferometers) and which will not switch to an incorrect state if the set and reset signals occur at the same time. Still further, it is important to provide latches whose state can be changed rapidly so as to be able to complete write, read, and erase operations quickly.

Accordingly, it a primary object of the present invention to provide a superconductive latch circuit which will work reliably using the same phase of the AC power applied to other circuits in the superconductive system of which it is a component.

It is another object of the present invention to provide an improved superconductive latch that can be powered by an AC current supply where the latch will reliably hold data stored therein when the AC power diminishes to zero and also when the AC power changes polarity.

It is another object of the present invention to provide an improved superconductive latch circuit using components which will support Josephson currents therethrough wherein the state of the latch is reliably determined even if a plurality of control signals thereto arrive at the same time.

It is a further object of the present invention to provide an improved superconductive latch for storing information, where said latch includes a storage loop which can operate to store data with only a single switch therein.

It is another object of the present invention to provide an improved superconductive latch circuit using switching devices through which Josephson currents pass, said improved latch being small and fast, and using a minimum number of superconductive switches.

It is a further object of the present invention to provide an improved latch for use in systems including both logic circuits and memory circuits, where the logic circuits and the latch circuits use the same AC power source.

It is a still further object of the present invention to provide an improved superconductive latch circuit which is very small and in which data is not lost regardless of the inputs applied thereto and the polarity of the AC current applied to the latch.

It is another object of the present invention to provide a latch circuit using Josephson devices which stores data as a circulating current of either polarity in a storage loop thereof.

DISCLOSURE OF INVENTION

The superconductive latching circuit of the present invention includes a storage loop in which information is stored as the presence and absence of a circulating current. The storage loop is comprised of only two components: a superconductive switch and an inductor, the switch and the inductor being interconnected by a superconductive conductor. The inductor can be merely the inductance associated with a control line. In a typical case, the superconductive switch is one through which Josephson current can pass, and is characterized by having a zero voltage state and a non-zero voltage state. A damping resistor can be optionally provided across the switch in order to minimize the amount of leakage current in the storage loop when the switch is in its zero voltage state.

The latch is also comprised of another superconductive switch through which an AC gate current can flow. This second switch has a zero voltage state and a non-zero voltage state and can also be a switch through which Josephson current passes. A control input to the second switch is the data signal. When the second switch is in its non-zero voltage state, the AC current is transferred into the storage loop. When the second switch is in its zero voltage state, the AC current is prevented from flowing into the storage loop.

A plurality of data inputs can be applied to this latch and it can be operated using the same AC power as is used to power logic circuits in a total system providing both logic and memory. In a first variation of the basic latch described hereinabove, the circulating current in the storage loop is fed back as a control current to the second switch (i.e., the switch connected to the AC power source). This is used to switch the input AC power away from the storage loop when there is already a binary 1 stored in the loop.

SET/RESET switches are also described wherein one of the outputs of a sense circuit (which detects the state of the storage loop) is fed back as a control signal to the superconductive switch in the storage loop, and also acts as one of the inputs to an AND gate to which a SET signal is also applied as an input. The AC power is switched to the superconductive loop when both inputs to the AND circuit are present simultaneously. In these SET/RESET latches, only changes in stored information are sent to the latch storage loop.

The sense circuit used to detect the state of the storage loop is not part of the inventive latch and can be comprised of a circuit which detects the presence and absence of a circulating current therein. Typically, the sense circuit is comprised of a switching device whose state is dependent upon the presence and absence of the circulating current in the storage loop. A suitable switching device is one which will pass a Josephson current, such as an interferometer.

The switches used in this invention are well known in the art, and can be the interferometers described in more detail by T. Gheewala in IBM Journal of Research and Development, Vol. 24, No. 2, Page 130, March, 1980. That article also describes the injection circuits, AND circuit, and OR circuit used in the present invention.

These and other objects, features, and advantages will be more apparent from the following more particular description of the preferred embodiments.

BRIEF DESCRIPTION OF THE DRAWINGS

FIG. 2 illustrates that the inventive latch design is suitable for use with general purpose input circuits.

BEST MODE FOR CARRYING OUT THE INVENTION

Figure 1:
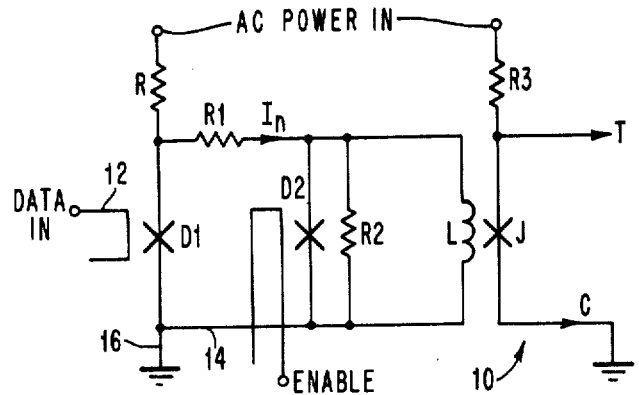
FIG. 1 is a circuit diagram of the simplest type of single phase AC latch in accordance with the present invention.

FIG. 1 shows a basic single phase latch in accordance with the present invention wherein data is stored in a superconductive loop formed by an inductance L and a switching device D2. This latch does not require a DC power supply or a two phase AC power system, but can work off the same AC power supply as the latching logic circuits (of course, the latch can operate with DC power also).

The latch is comprised of a circuit including the switch D1 and a superconductive loop formed by inductance L and switch D2, where the inductance L can be the inductance associated with a superconductive control line, and where the switch D2 can be an interferometer, as is well known in Josephson device circuits. Switch D2 is non-latching (i.e., non-hysteretic) because of the inductance L across it, and resets automatically to a zero voltage state in accordance with its LC reset time, even when the ENABLE signal is present. The superconductive loop holds a circulating current of either polarity which can be indicative of a binary state 1, or no current, which can be indicative of a binary state 0.

A gate current supply comprising a source of AC power and the resistor R provides gate current to switching device D1, which can also be an interferometer. Switch D1 is usually a latching switch which maintains its state when switched by the DATA input. That is, it will reset only when the gate current through it goes to zero. Its function is to selectively deliver the AC current to the superconductive storage loop comprising inductance L and switch D2.

Resistance means R1 is used to keep the supply current flow through switch D1 to ground when D1 is in its zero voltage state. This resistance means could be a superconductive switch of the type described herein, or a resistor, and is shown as a resistance in this schematic diagram. Thus, unless switch D1 is switched to its voltage state by the presence of input DATA, the AC input current will be delivered to ground through switch D1. Resistor (switch) R1 can be used to control how much current is transferred into the storage loop, and this in turn is determined by how much current is required for accurate sensing of the state of the storage loop.

Resistor R2 is a damping resistor which minimizes $I_{min}$, the amount of current through switch D2 when this switch is reset to its zero voltage state. This will be more apparent when the operation of the latch is described but, at this stage of presentation, it is only necessary to state that R2 minimizes leakage currents through switch D2.

Circuit 10 is not part of the inventive latch circuit but is representative of many types of circuits which can be used to detect the state of the superconductive storage loop of the latch. It is comprised of a switch J whose state can be controlled by the presence and absence of circulating current in the storage loop. Typically, switch J is capable of supporting a Josephson current therethrough, and could also be an interferometer of a type well known in the art. A true output T is provided at one terminal of switch J, while a complement output C is provided at the other terminal. The same AC power source used to power the latch circuit can be used to provide power to the detection circuit 10, using the current limiting resistor R3.

In operation, switch J detects the data stored in the storage loop of the latch at the beginning of every cycle of the AC power. If a binary 1 is stored in the latch storage loop, a voltage output will appear at the true output of circuit 10, while a zero voltage output will appear at the complement terminal C. If a binary 0 is stored in the latch storage loop, the true output of sensing circuit 10 will be zero, while a voltage will appear at the complementary output.

Latch Operation

This latch has two signal inputs, the first providing the DATA signal to switch D1, and the second providing the ENABLE signal to switch D2. The ENABLE signal switches device D2 to its non-zero voltage state so that new data can be written into the storage loop. The DATA signal is used to switch device D1 in order to deliver AC current $I_n$ to the storage loop. As will be understood by those of skill in this art, the control means or switches D1 and D2 could include magnetic coupling or direct coupling of the control signals to the switches.

To write a binary 1 into the latch, it is necessary to create a circulating current in the storage loop. When a current appears in data line 12, indicating the presence of a binary 1, switch D1 is switched to its finite voltage state. Therefore, AC current through resistor R will be switched from its path through D1 to a path through resistor R1 and into the storage loop. This current flows through D2 and then to ground along the superconductors 14 and 16. The ENABLE signal is ON at the same time as the input DATA signal so that the presence of the gate current $I_n$ and the control current ENABLE on D2 switches it to its non-zero voltage state. This transfers the current $I_n$ to the inductor L, rather than going through D2 and then to ground via conductors 14 and 16.

Switch D2 cannot maintain itself in the voltage state due to the inductive shunt across it. Therefore, it will return to its zero voltage state with a time constant dependent upon the inductance L and the capacitance of switch D2. Next, when the AC power diminishes to zero, a circulating current will be generated in the storage loop to conserve the flux in the superconducting loop. However, switch D1 will return to its zero voltage state when the AC power diminishes to zero. When that occurs, the now opposite polarity AC current will flow through D1 and be isolated from the storage loop. It will not flow through conductor 14, switch D2 and resistor R1, due to the presence of resistor R1.

As will be more apparent when the ERASE operation is described, it is only when D2 is switched to its non-zero voltage state that the circulating current in the storage loop can diminish. It will diminish until D2 switches back to its zero voltage state. However, the circulating current may not completely diminish to zero before switch D2 returns to its zero voltage state, and therefore some current $I_{min}$ may be left in the storage loop. The function of resistor R2 is to damp the storage loop in order to minimize the leakage current $I_{min}$.

In order to write a binary 0, it is only necessary to provide an ENABLE signal. There is no data input on line 12 when a binary 0 is to be written. If the data stored in the loop is a binary 1, the ENABLE signal switches D2 to its voltage state, which allows the trapped flux in the storage loop to be expelled. Thus, the circulating current will diminish to the value $I_{min}$ through switch D2. Depending upon the design of the circuit comprising D2, R2, and L, switch D2 will not return to its zero voltage state until substantially all of the circulating current has diminished to zero. If the data stored in the loop is already a binary 0, D2 will not switch when ENABLE is present, since there is no gate current through D2.

In the operation of this storage cell, it is important that data not be lost when the AC input power diminishes to zero, or changes its polarity. This is not a problem when a binary 0 is stored, since there is no circulating current in the storage loop in that situation. However, if a binary 1 is stored, it is represented by a circulating current which must not diminish as the AC power goes to zero or changes polarity. Therefore, the ENABLE signal must diminish to zero at the same time as the input AC signal in order to prevent switch D2 from being put in its non-zero voltage state.

As is apparent from the description thus far, there will be no change in the stored data as long as there are no DATA or ENABLE inputs, even though the AC power is zero or has either plus or minus polarity.

In order to erase information from the latch, the ENABLE signal is applied to switch D2 to its non-zero voltage state. As has been explained, the circulating current in the storage loop will then diminish. However, it is not necessary to erase data in the storage loop before again writing data into the loop. The following will describe the reasons why this is true.

Assuming that the data in the storage loop is a binary 0 and that it is desired to write a binary 0 into the loop, an ENABLE signal will be applied. This will have no effect because there was no circulating current in the loop. Since the input data is zero, switch D1 never is placed in its non-zero voltage state so the input AC power has no effect (i.e., it is isolated from the storage loop).

If the data in the storage loop is a binary 1 and it is desired to write a binary 0 into the loop, only the ENABLE signal will be present. As explained, this will erase the binary 1 from the storage loop and no new circulating current will be established therein since D1 will remain in its zero voltage state. On the other hand, if the data in the storage loop is a binary 1 and it is desired to write a new binary 1 into the loop, the following situations can apply:

(a) If the ENABLE signal appears before the DATA signal, D2 will switch to its non-zero voltage state and the circulating current in the loop will be lost. When the data signal switches D1 to its non-zero voltage state, AC current $I_n$ will be delivered to the storage loop to again write a binary 1 into the loop.

(b) If the DATA signal arrives before the ENABLE signal, two situations occur depending upon the polarity of the AC power with respect to the direction of the circulating current in the storage loop. In both situations, switch D1 will be in its non-zero voltage state and AC power will be delivered to the storage loop.

1. If the AC power is of the same polarity as the AC power previously delivered to the storage loop to write the binary 1 stored therein, then the net current through switch D2 will be $I_{min}$. This is because the direction of the now applied AC current through D2 will be opposite to the direction of the stored circulating current through D2. Then, when the ENABLE signal is applied, D2 will not switch to its non-zero voltage state because the net gate current through it is too low. Since a binary 1 was already stored in the storage loop, it will remain therein since D2 never switches to its voltage state.

2. If the AC power is of the opposite polarity to the AC power previously delivered to the storage loop to create the circulating current therein, then the AC power and the circulating current through switch D2 will be in the same direction and will add. This net current may be sufficient to switch D2 to its non-zero voltage state without the presence of the ENABLE signal. If this is so, the circulating current in the loop will diminish and the AC signal will produce a new circulating current in the loop. If the net current through D2 is not sufficient to switch it to its non-zero voltage state, the presence of the ENABLE signal will switch it to this voltage state. Again, the previous circulating current will be lost and a new binary 1 written into the storage loop.

In the design of the latch of FIG. 1, the current limiting resistor R is generally quite large in order to minimize power supply disturbs (i.e., to minimize the magnitude of disturb currents which occur when D1 and D2 switch their states). The switches D1 and D2 are typically interferometers or other types of superconducting switches such as direct coupled isolation devices of the type described by T. Gheewala. They are chosen for their switching speeds and their margins are optimized with the AC supply current in order to provide good gain and speed. An additional interferometer (switch) can be included in series with the inductance L as a GLOBAL RESET control to reset the data to zero. Similarly, a small resistor can be included in series with the inductor to make a self-resetting latch.

The following table describes all the possible events that can occur, assuming that a circulating current of either polarity in the storage loop corresponds to a binary 1.

TABLE

| OLD DATA | INPUT DATA | ENABLE | NEW DATA | COMMENTS |
|---|---|---|---|---|
| 0 | 0 | 0 | 0 | No switching of D1 occurs. |
| 0 | 0 | 1 | 0 | No switching of D1 occurs. |
| 0 | 1 | 0 | 0 | No switching of D2 occurs. |
| 0 | 1 | 1 | 1 | A circulating current is stored. |
| 1 | 1 | 1 | 1 | No switching of D2 occurs.* |
| 1 | 0 | 1 | 0 | Circulating current is reset to zero. |
| 1 | 1 | 0 | 1 | * |
| 1 | 1 | 1 | 1 | * |

*In these cases, nothing happens if the circulating current $I_c$ is of the opposite polarity as compared with the injection current $I_n$, because they cancel each other out. If the two currents are of the same polarity they will add and if that exceeds the threshold current it will switch interferometer D2, leaving behind a circulating current of the opposite polarity. Thus, the circulating current changes the polarity without affecting stored data which remains 1.

FIG. 2

Figure 2:
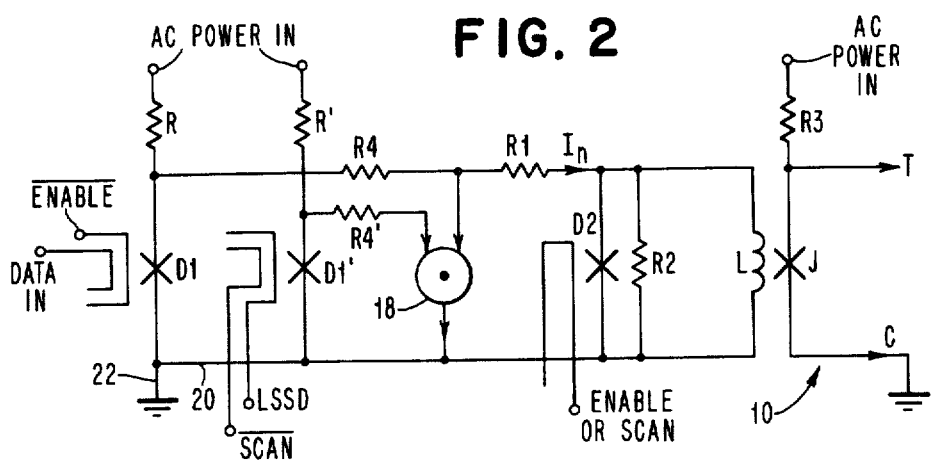
FIG. 2 is a circuit diagram of the latch of the present invention with the addition of a current injection logic 2-input AND gate.

FIG. 2 shows the basic latch of FIG. 1, except that the input circuitry to the latch is different. The latch of FIG. 2 illustrates that a general purpose input from any type of circuit can be used with the latch of the present invention. Where possible, the same reference symbols are used for the components in the circuit of FIG. 2 as were used for the corresponding components in the circuit of FIG. 1. Thus, the storage loop is comprised of inductance L and the switch D2. Binary information is stored in the storage loop in accordance with the presence or absence of a circulating current of either polarity in the loop. Test circuit 10 is used to detect the presence or absence of a circulating current in the loop, and functions identically to the test circuit 10 of FIG. 1.

In more detail, the circuit of FIG. 2 has an input comprised of a current injection logic 2-input injection gate 18. Inputs to gate 18 are provided through resistances R4 and R4'. AC power is delivered from a source through resistors R and R'. Switch D1 acts the same as switch D1 in FIG. 1.

The actual storage operations wherein data is written into, erased, or read from the storage loop of the latch are the same as those described with respect to the circuit of FIG. 1. Therefore, they will not be reviewed here. The only difference between the circuit of FIG. 2 and that of FIG. 1 is that the input to the circuit of FIG. 2 includes additional signal inputs. For example, activation of both switch D1 and switch D1' at the same time will cause AC power to be delivered to the storage loop of the latch. Either of the two inputs—DATA and ENABLE—is required to switch D1. However, when D1' is switched to its non-zero voltage state, the AC power will be switched to injection device 18, rather than to the storage loop. Either of the two inputs—$\overline{SCAN}$ and LSSD—is required to switch D1'. These inputs are well known in the design of logic circuits, LSSD being an acronym for Level Sensitive Scan Design, while SCAN is an input which is stored by activating the LSSD control.

Injection gate 18 is similar to an AND gate in that it will provide an output only when inputs are simultaneously present through resistors R4 and R4'. Thus, when only one of the devices D1 and D1' is switched to the non-zero voltage state, AC power will not be delivered to the storage loop but instead will pass through injection gate 18 and then return to ground via conductors 20 and 22.

While a 2-input circuit is shown in FIG. 2, it is possible to have a plurality of data inputs. Thus, additional switches D1 can be provided where the inputs to these switches would be different data signals.

FIG. 3

Figure 3:
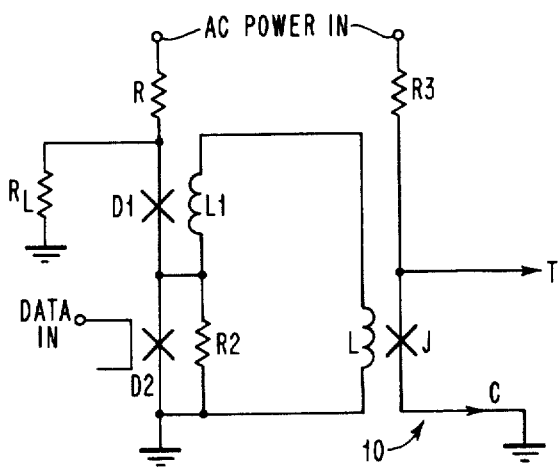
FIG. 3 is a schematic diagram of the latch of the present invention in which a feedback loop is used to keep the AC input power out of the storage loop of the latch.

In general, the single phase AC latch of this invention includes a storage loop in which the data is stored. The storage loop is isolated from the AC power by means of one or more switches D1. Thus, when the power supply comes up it does not interfere with the stored data. A feedback loop can also be used to keep the AC power out of the storage loop, as is shown in the circuit of FIG. 3. However, the circuit of FIG. 3 has inferior operating margins on the supply current as compared to the latch circuits of FIGS. 1 and 2. Again, the same reference numerals are used whenever possible to identify components which have the same function as those described in FIG. 1.

In FIG. 3, the latch storage loop is the superconductive loop comprised of inductances L and L1 and the switch D2. Detection circuit 10 is the same as that shown in FIG. 1. Resistance R2 is a damping resistor for switch D2.

In the operation of the latch, it is necessary to isolate the storage loop from the AC power so that it does not interfere with the stored data. The stored data may be lost if the AC power supply current is added to the circulating current in the loop, for this may cause switching of D2 and therefore loss of the stored information. In the circuit of FIG. 3, this is prevented by the feedback loop wherein a storage loop circulating current acts as a control current that switches D1 to its non-zero voltage state, thereby diverting the AC supply current to the load resistor $R_L$.

In more detail, a binary 1 is written into the storage loop by switching D2 to its voltage state when DATA = 1. Since D1 is in its zero voltage state, the AC supply current will be diverted into the storage loop and appear as a circulating current therein. This circulating current will pass through L1 and be a control current for D1. Because D1 will be switched to its non-zero voltage state, AC supply current will be diverted to load resistor $R_L$ and will not be transferred into the storage loop to interfere with the circulating current therein.

A RESET pulse applied to switch D2 is used to reduce the circulating current to zero. On the other hand, if a binary 0 were stored in the storage loop, the AC gate current will flow through both D1 and D2 to ground. Application of a SET pulse to D2 will store a circulating current in the loop, since the AC power will then be delivered to the loop.

Set/Reset Latch

Figure 4:
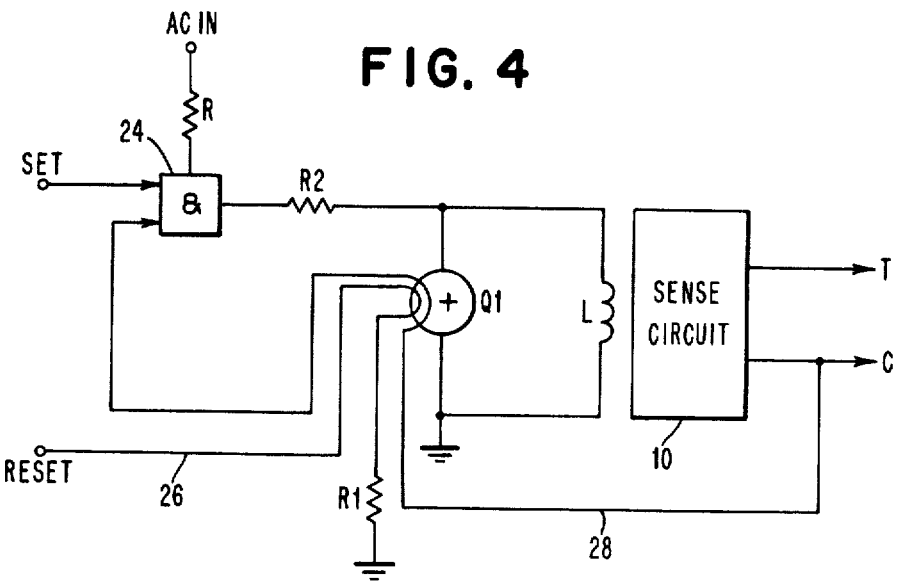
FIG. 4 is a circuit diagram of a set/reset latch based on the principles of the present invention.
Figure 5:
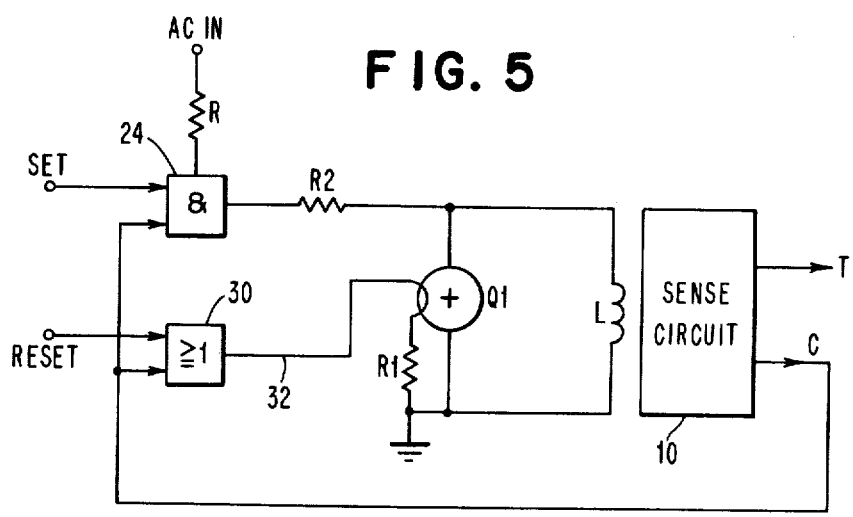
FIG. 5 is a circuit diagram of a modified version of the set/reset latch of FIG. 4, wherein "toggle" capability is provided by the addition of an OR gate G2 to the circuit generally shown in FIG. 4.

(FIGS. 4 and 5)

The circuits of FIGS. 4 and 5 provide latches where two controls are not required to write information. In these circuits, only changes are sent to the latch storage loop. That is, only when it is desired to change a stored 0 to a stored 1, or a stored 1 to a stored 0, are the currents propagated to the storage loop. In both of these circuits the SET signal writes a binary 1 into storage while the RESET signal writes a binary 0.

In FIG. 4, the SET signal is applied as an input to a 2-input AND circuit 24, while the RESET signal is applied as a current in the control line 26, which is a control line for the superconductive switch Q1 (which can be an interferometer or another type of switch).

The latch storage loop is comprised of inductance L and the switch Q1. The output of AND gate 24 is a current which passes through resistance R2 to the storage loop. Sense circuit 10 is a circuit such as that shown in FIG. 1, and is used to detect the binary state of the storage loop comprising inductance L and switch Q1. AC power is supplied to gate 24 via resistor R.

In the circuit of FIG. 4, the complement output is fed back via conductor 28 as a control signal to switch Q1 and as an input to AND gate 24. Resistance R1 is a terminating resistor connected to ground and to conductor 26.

In the operation of this circuit, the complement output inhibits the SET control when the complement output C=0 (i.e., when the stored data=1). The SET signal writes a 1 into the storage loop while the RESET signal writes a 0 into the storage loop.

For the RESET operation, the RESET current is directly applied to the storage loop switch Q1 so that if a circulating current, representing a binary 1, is present in the storage loop, Q1 will switch to its non-zero voltage state and reduce the circulating current to $I_{min} \sim 0$. If the data stored in the loop were initially 0, no switching of Q1 would take place, since there would be no gate current through Q1.

For the SET operation, if the data stored in the loop is initially a binary 1, and the SET control signal is applied, nothing will happen because the complementary output C=0, and therefore the 2-input AND gate 24 will not be switched on in order to provide an output therefrom. This eliminates unnecessary writing of a binary 1 in the storage loop when the stored data is already a binary 1, and this eliminates timing constraints with respect to the onset of the SET and RESET pulses. On the other hand, if the stored data is a binary 0, the complement output C=1. This switches AND gate 24 and Q1 and thus writes a binary 1 into the storage loop.

If the SET and RESET pulses are both applied simultaneously when the stored data is a binary 1, the stored data will change to a binary 0. This will occur because the complement output will be 0 and therefore there will be no output from AND gate 24. However, the RESET pulse will switch Q1 and the circulating current in the loop will diminish. However, if the stored data were a binary 0 when the SET and RESET pulses are applied, the outcome depends on which of these control signals arrives first. This ambiguity is resolved in the circuit of FIG. 5, which will now be explained.

The ambiguity in operation of the circuit of FIG. 4 when the SET and RESET signals are applied simultaneously is resolved in the circuit of FIG. 5 by the addition of an OR gate 30. Components having similar functions to corresponding components in FIG. 4 bear the same labels. The AND circuit 24 and OR circuit 30 are well known in the Josephson technology, and reference is made to a paper by T. Gheewala which appeared in the IBM Journal of Research and Development, Vol. 24, No. 2, Page 130, March 1980.

In FIG. 5, when SET and RESET signals are both applied during a positive or negative cycle of the applied AC power, the latch simply reverses state. That is, if the stored data were a binary 1 it becomes a binary 0 and, if the stored data were a binary 0, it becomes a binary 1. This provides a toggle feature which is extremely useful for designing counters. The addition of OR gate 30 also permits two turns of control current on Q1 to allow a low $LI_0$ product and hence a low floor necessary to switch out of fault states. The operation of the circuit of FIG. 5 will now be explained in more detail.

If the SET and RESET signals appear together within either the positive or negative cycle of the applied AC power, a toggle action occurs. If the stored data were initially a binary 0, then the true output T=0 and the complementary output C=1. The complementary output is fed back to fire the OR gate 30 and one half of the AND gate 24. Current will be provided in control line 32, but Q1 won't switch since there is no circulating current through it (stored data is 0). If the SET and RESET signal occur simultaneously, the effect on Q1 will be the same since a control current was already present in conductor 32. However, the presence of the SET signal will cause an output from AND gate 24 and the AC power will be delivered to Q1 through resistor R2. Since AC current will now flow through Q1, it will switch and the AC current will be delivered to the inductance L. This will store a binary 1 in the storage loop.

If a binary 1 were stored initially in the storage loop, the complement output C would be 0. This would mean that one of the inputs to AND gate 24 would be absent and AC power would not be delivered to the storage loop through resistor R2. However, the presence of the RESET signal would cause a control current in conductor 32 which would switch Q1 to its voltage state (the presence of the binary 1 in the storage loop means that a circulating current flows through Q1). When Q1 switches, the circulating current will diminish and the latch will switch to a binary 0.

Thus, when the SET and RESET signals are simultaneously present during a positive or negative cycle of the applied AC power, toggle action will be obtained. This is a very compact SET/RESET latch which eliminates unnecessary writing of a binary 1 on a stored binary 1 and thereby eliminates the need for delay lines and timing constraints with respect to the SET and RESET signals.

In the circuits of FIGS. 4 and 5, the AND gate 24 provides a function similar to the switches D1 shown in FIGS. 1-3. That is, it controllably couples the AC power to the storage loop and keeps the AC power from the storage loop when the AC power diminishes to zero or changes polarity.

In the practice of this invention, only a minimum number of superconductive switches is required to provide a latch circuit using single phase AC power, where the single phase AC power is shared by both memory and logic circuits. This saves wiring channels and I/O pins. Further, there is no danger of the storage loop being hung-up in a voltage state if the SET and RESET signals appear simultaneously. Still further, since the inductance in the storage loop need not be a separate inductance but can be the inductance of a control line, the circuit is very fast and occupies a small area. For example, the inductance can be 50-100 pH while the resistance of the switch D2 (or Q1) is only 10-15 ohms. This contrasts with prior art circuits using switches in both branches of the superconducting loop and wherein additional inductors having inductances of 300-500 pH are required.

It will be appreciated by those of skill in the art that a multi-port latch can be provided in accordance with the general principles described with respect to the circuit of FIG. 2. For example, two data inputs can be applied to two separate AND circuits, each AND circuit having a clock signal applied thereto. The outputs of the AND circuits can be inputs to an OR circuit to which the AC power is applied.

The storage loop switch (D2 or Q1) has two separate control lines for the two clock signals (or the same control line where both clock signals are applied thereto). Application of the first data signal is achieved by applying the first clock pulse and the first data signal, while application of the second data signal is applied by simultaneous application of the second data signal and the second clock pulse.

While the invention has been particularly shown and described with reference to preferred embodiments thereof, it will be understood by those of skill in the art that the foregoing and other changes in form and details may be made therein without departing from the spirit and scope of the invention.

Having thus described my invention, what I claim as new, and desire to secure by Letters Patent is:

1. A superconductive latch circuit for storing data therein, comprising in combination:
 a superconducting storage loop comprising a series connection of a single controllable superconducting switch and an inductance, said switch having at least two states wherein a first state thereof is characterized by a zero voltage across it and a second state thereof is characterized by a non-zero voltage across said switch, said loop being able to support a circulating current therein representative of said data when said switch is in said first state,
 first control means for controlling the state of said switch,
 supplying means for supplying current from a power source to said storage loop, said supply means being comprised of a second controllable superconducting switch capable of having at least first and second states and being connected in a series connection with said power source, said second switch being in parallel with said storage loop, and electrical means between said series connection and said storage loop for electrically connecting said power source to said storage loop, said second switch allowing transfer of current from said power supply to said storage loop when it is in its second state and preventing said transfer when it is in its first state,
 second control means for applying said data as a control signal to said second switch to affect the state of said second switch,
 wherein data stored in said loop is not lost when said current diminishes to zero or is changed in polarity.

2. The circuit of claim 1, where said first and second superconductive switches are capable of supporting Josephson current therethrough.

3. The circuit of claim 2, where said first and second switches are comprised of interferometers.

4. The circuit of claim 1, where said inductance is the inductance associated with a superconductive control line.

5. The circuit of claim 1, further including a damping resistor in parallel with said single superconductive switch.

6. The circuit of claim 1, where said electrical means includes a resistance means.

7. The circuit of claim 1, where said first and second control means includes current carrying conductors in which electrical currents pass to establish magnetic fields coupling to said switches.

8. The circuit of claim 1, further including a sense circuit for detecting the presence and absence of a current in said storage loop.

9. The circuit of claim 1, where said single superconductive switch is biased to be non-latching and said second superconductive switch is biased to be latching.

10. The circuit of claim 1, wherein said storage loop includes a portion thereof which is a control line for said second switch, current in said storage loop portion affecting the state of said second switch.

11. The circuit of claim 10, where said portion includes an inductance located near said second switch.

12. A superconductive latch circuit for storing data therein, comprising in combination:
 a superconductive storage loop for storing data therein as an electrical current, said loop being comprised of a non-latching first switch and an inductance, said switch being capable of having at least first and second voltage states, wherein said electrical current is maintained in said storage loop when said switch is in its first state and diminishes when said switch is in its second state,
 first control means for putting said non-latching switch into its second state,
 supply means for controllably supplying AC current to said storage loop, said supply means including an AC power source in series with a latching second switch which has at least first and second voltage states, said latching switch diverting said AC current to said storage loop when it is in its second voltage state,
 second control means for applying said data to said latching switch to put said latching switch into its second voltage state,
 wherein data stored in said loop is not lost when said AC current diminishes to zero or changes polarity.

13. The circuit of claim 12, where said second switch and said first switch have Josephson current therethrough when they are in their first voltage states.

14. The circuit of claim 12, where a portion of said storage loop is located sufficiently near said second switch that current in said loop is a control signal affecting the state of said second switch.

15. The circuit of claim 12, further including a damping resistor connected in parallel with said first switch.

16. The circuit of claim 15, further including a resistance connected between said second switch and said storage loop.

17. A superconductive latch circuit for storing data therein, comprising in combination:
 a superconductive storage loop including a first switch capable of at least two voltage states and an inductance, said storage loop being capable of holding a circulating current therein when said first switch is in a first voltage state, wherein said first switch cannot sustain a voltage thereacross due to said inductance,
 a damping resistor connected in parallel with said first switch,
 first control means for putting said first switch into a second voltage state, said switch being incapable of retaining its second voltage state,
 a supply means for supplying current to said storage loop for storage therein representing said data, said supply means including an input switch, a current means for supplying said current to said input switch having at least one input thereto for controlling the state of said input switch, a first electrical path connected to said input switch for diverting said current away from said storage loop and a second electrical path connected to said switch for sending said current to said storage loop when said input switch is in a second state.

18. The circuit of claim 17, where said input switch is an AND gate having at least two inputs thereto and an output which connects said current means to said storage loop.

19. The circuit of claim 18, further including an OR gate having at least two inputs thereto and an output which is applied as a control signal to said first switch in said storage loop, in order to place said first switch in its second voltage state.

20. The circuit of claim 19, further including a sense circuit for detecting the presence and absence of current in said storage loop, an output of said sense circuit being fed back to said OR gate and to said AND gate.

21. A superconductive SET/RESET latch for storing data therein, comprising in combination:
a superconductive storage loop including an inductance and a single superconductive switch capable of having at least a first and second state, said superconductive loop being able to retain an electrical current therein when said switch is in its first state,
a sense circuit responsive to the presence and absence of said electrical current in said storage loop, an output of said sense circuit being fed back to be a control signal to said switch, the presence of a control signal placing said switch in said second state,
an AND gate having at least two inputs thereto, one of which is the output fed back from said sense circuit,
a source of current which is delivered to said storage loop when said at least two inputs are simultaneously present to said AND circuit, and
a reset control signal for switching said storage loop switch to its second state.

22. The circuit of claim 21, further including an OR gate connected between said sense circuit and said switch and receiving the output fed back from said sense circuit as one input thereto, another input to said OR gate being a reset signal, the output of said OR gate being applied as a control signal to said switch in order to place it in its second state, wherein said sense circuit output is also fed back as one input to said AND gate.

23. The circuit of claim 21, where said switch operates in a non-latching mode, said switch being incapable of staying in its second state.

* * * * *